US009601180B2

(12) United States Patent
Coquelin et al.

(10) Patent No.: US 9,601,180 B2
(45) Date of Patent: Mar. 21, 2017

(54) AUTOMATIC PARTIAL ARRAY SELF-REFRESH

(71) Applicant: ST-Ericsson SA, En Liquidation, Plan-les-Ouates (CH)

(72) Inventors: Maxime Coquelin, Joue l'Abbe (FR); Loic Pallardy, Rouillon (FR)

(73) Assignee: Optis Circuit Technology, LLC, Plano, TX (US)

( * ) Notice: Subject to any disclaimer, the term of this patent is extended or adjusted under 35 U.S.C. 154(b) by 0 days.

(21) Appl. No.: 14/372,244

(22) PCT Filed: Jan. 23, 2013

(86) PCT No.: PCT/EP2013/051247
§ 371 (c)(1),
(2) Date: Jul. 15, 2014

(87) PCT Pub. No.: WO2013/110663
PCT Pub. Date: Aug. 1, 2013

(65) Prior Publication Data
US 2015/0026399 A1  Jan. 22, 2015

Related U.S. Application Data

(60) Provisional application No. 61/595,227, filed on Feb. 6, 2012.

(30) Foreign Application Priority Data

Jan. 26, 2012  (EP) ..................................... 12305104
Jun. 26, 2012  (EP) ..................................... 12305742

(51) Int. Cl.
*G06F 12/00*  (2006.01)
*G06F 13/00*  (2006.01)
(Continued)

(52) U.S. Cl.
CPC ...... *G11C 11/40622* (2013.01); *G06F 1/3275* (2013.01); *G06F 13/1668* (2013.01);
(Continued)

(58) Field of Classification Search
None
See application file for complete search history.

(56) References Cited

U.S. PATENT DOCUMENTS 5,469,559 A     11/1995  Parks et al.
7,061,914 B2 *  6/2006   Mankins ............. H04L 49/9094
                                              370/392
(Continued)

FOREIGN PATENT DOCUMENTS

EP         2 020 659 A1    2/2009

OTHER PUBLICATIONS

Program Counter in Academic press Dictionary of science and technology.*
(Continued)

*Primary Examiner* — Jared Rutz
*Assistant Examiner* — Marwan Ayash
(74) *Attorney, Agent, or Firm* — Spencer C. Patterson; Grable Martin Fulton PLLC

(57) ABSTRACT

Methods of configuring dynamic memory associated with a processing system, are described. The dynamic memory is configured in a plurality of blocks, the method comprises: a) receiving information relating to a utilization status of the memory; b) processing the received information to determine at least one first block of the memory that is currently not in use for information storage; and c) configuring the at least one first block to be excluded from an information refresh process.

16 Claims, 5 Drawing Sheets

(51) Int. Cl.
*G06F 13/28* (2006.01)
*G11C 11/406* (2006.01)
*G06F 1/32* (2006.01)
*G06F 13/16* (2006.01)

(52) U.S. Cl.
CPC ...... *G11C 11/40615* (2013.01); *G06F 1/3203* (2013.01); *G11C 11/406* (2013.01); *G11C 11/40611* (2013.01); *G11C 11/40618* (2013.01); *Y02B 60/1225* (2013.01); *Y02B 60/1228* (2013.01)

(56) References Cited

U.S. PATENT DOCUMENTS

| | | | | |
|---|---|---|---|---|
| 7,953,921 | B2* | 5/2011 | Walker | G11C 11/406 365/222 |
| 2003/0023825 | A1* | 1/2003 | Woo | G06F 12/023 711/170 |
| 2003/0028711 | A1* | 2/2003 | Woo | G06F 1/3225 711/106 |
| 2005/0108460 | A1* | 5/2005 | David | G11C 11/406 711/5 |
| 2005/0132131 | A1* | 6/2005 | David | G11C 11/4094 711/105 |
| 2007/0106860 | A1* | 5/2007 | Foster | G06F 1/3225 711/170 |
| 2007/0136531 | A1* | 6/2007 | Liu | G06F 9/5016 711/130 |
| 2009/0109783 | A1 | 4/2009 | Lee | |
| 2009/0113162 | A1* | 4/2009 | Di-Zenzo | 711/171 |
| 2011/0131432 | A1* | 6/2011 | Berke | G06F 1/3203 713/320 |
| 2013/0100755 | A1* | 4/2013 | Youn | G11C 11/40622 365/222 |

OTHER PUBLICATIONS

Register in "Hargrave's Communications Dictionary".*
International Search Report issued in corresponding International application No. PCT/EP2013/051247, date of mailing Jun. 24, 2013.

* cited by examiner

AUTOMATIC PARTIAL ARRAY SELF-REFRESH

BACKGROUND

Technical Field

The described embodiments generally relate to memory management in computing systems. More particularly, the embodiments relate to an apparatus for providing control of memory assigned to a processor for performing processing functions. More particularly still, the embodiments relate to power management control of such memory. The embodiments also relate to associated methods for providing such control, and to computer program products for implementing the methods.

The embodiments find applications in, in particular, mobile terminal systems, e.g., cell phones, smart phones, tablets etc.

Related Art

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

As a general development trend, processor speed, memory speed and memory capacity used for processing systems all increase with each new generation of processing system.

To increase memory speed, Double Data Rate (DDR) memory has been developed. DDR memory provides for data to be written to, and read from, the memory at high speeds. Additionally, the capacity of DDR memory used in, for example, embedded systems has been continuously increasing in order to fulfil performance needs.

However, with this increase in DDR memory capacity, an unwanted side effect is a commensurate increase in the DDR power consumption. As a result the autonomy of platforms, and thus the user experience, tends to be reduced. Since, for example, the battery life of a mobile platform using the DRR memory will also be reduced.

To combat this problem, the Low Power Double Data Rate (LPDDR) standard has been developed. This brings support to single-ended partial array self-refresh, which enables a reduction in power consumption. Additionally, the LPDDR2 standard brings support to bank and segment (LPDDR-S4) selective partial array self-refresh.

However, these low-power modes may be problematic because, for instance, the content retention of the memory areas set in these modes is not guaranteed.

In all Rich Operating Systems (OS) available on the market, such as Linux or Windows, and also in most existing OS, the management of the DDR memory refresh is not linked with the memory allocator. This is the case, for example, for both the Deep Power Down (DPD) and Partial Self Refresh (PASR) functions that are sometimes enabled in memory devices. Thus, in such OS control of memory refresh is not possible.

A further function, which is available in Linux, is a technique called "Memory Hotplug". This enables some chunks of memory to be unplugged from the memory allocator point of view, and to plug some memory into the system. This method has been developed for servers, in order to be able to change some memory cards during maintenance operations without stopping the execution of the server. This method, nevertheless, is not particularly fast and requires a large amount of CPU (central processor unit) resources to implement. Thus, it is not suitable for application to embedded systems. A further problem with this method is implementation of a suitable decision as to when to plug in, or unplug, some part of the memory.

US2009/0109783 discloses a circuit that allows masking of memory to permit control of refresh of the memory.

It is an aim of the embodiments herein described to overcome or mitigate at least some of the above described limitations.

SUMMARY

According to a first aspect there is provided a method of configuring dynamic memory associated with a processing system, the dynamic memory being configured in a plurality of blocks, the method comprising: a) receiving information relating to a utilisation status of the dynamic memory; b) processing the received information to determine at least one first block of the dynamic memory that is currently not in use for information storage; and c) configuring the at least one first block to be excluded from an information refresh process.

Thus, advantageously, if a block of dynamic memory is not in use for information storage, then this block can be excluded (masked) from the information refresh process. As a result, energy need not be wasted in refreshing a block of memory that is not holding any information.

Further, memory is not "unplugged" from the memory allocator. Masking and unmasking of DDR segments/banks refresh is transparent from the point of view of the memory allocators and from the point of view of the consumers, i.e. entities which consume memory resources. In other words, a memory allocator present in the processing system will see all the DDR memory as refreshed. Further, there is no need for a memory governor to decide when some DDR segments/banks can be unplugged or plugged.

In embodiments, the method may further comprise processing the received information to determine at least one second block of the dynamic memory that is currently in use for information storage, and the configuring further comprises configuring the at least one second block to be included in the information refresh process.

Thus, advantageously, the method can ensure that memory blocks that are storing information will be included (un-masked) from the refresh process, thereby ensuring that information is not lost.

In embodiments, the method may provide that the received information comprises a base address and size of a portion of the dynamic memory that is in use for information storage or that has been freed from use for information storage. Thus, advantageously, since this is the form taken by memory allocation messages generally used in the art, the method can employ these messages. In embodiments, the method may further provide that a counter is maintained in respect of each block of the memory, and that the counter for a block is incremented each time the processing identifies that information is to be stored in that block, and decremented each time the processing identifies that a part of the block has been freed from use for information storage.

Thus, advantageously, by using such counters, full details of memory allocation are unnecessary for the method. Rather, the method simply maintains a record of whether any part of a block of memory is in use.

In embodiments, the method may provide that a block is added for inclusion in the information refresh process if its respective counter changes from zero to a positive number and wherein a block is removed from inclusion in the information refresh process if its respective counter changes from a positive number to zero.

Thus, advantageously, the method according to such embodiments provides an easy means of determining whether to include blocks in the refresh process.

In embodiments the method may further provide that the counters are set to zero at initialisation of the processing system. Thus, the correct usage status of the blocks can be ensured.

The method may also provide that the actions of a) receiving the information, b) processing the received information and c) configuring the at least one block as described above are repeated each time a message relating to a utilisation status of the memory is received. Thus, it can be ensured that the utilisation status of the memory is kept up to date.

In embodiments the blocks of dynamic memory may be memory segments or memory banks.

In embodiments, the information relating to a utilisation status of the dynamic memory may comprise a message received from a memory allocator. Thus, the method can use standard messages that are already provided by the memory allocator.

A second aspect relates to an electronic device comprising an embedded system according to the first aspect.

According to a third aspect, there is further proposed a method of managing a system comprising a Central Processing Unit (CPU) with a memory allocator, and memory banks or segments. The method comprises dynamically masking and unmasking a refresh of the memory banks or segments. The Operating System (OS) of the CPU notifies an interface between the CPU and the memory banks or segments of memory allocation and de-allocation operations, e.g. by providing the addresses and sizes of each chunk of memory. The interface causes, based on memory chunk information, a masking of the refresh of the memory segments or banks related to memory chunk whereby said segments or banks are no more refreshed, or an unmasking of the refresh of the memory segments or banks related to memory chunk so that said segments or banks are made accessible by the CPU and/or by any other memory consumer of the system.

A fourth aspect relates to a computer program product comprising one or more stored sequences of instructions that are accessible to a processor and which, when executed by the processor, cause the processor to carry out the steps of the method of the first aspect of the present invention.

BRIEF DESCRIPTION OF THE DRAWINGS

The present invention is illustrated by way of example, and not by way of limitation, in the figures of the accompanying drawings, in which like reference numerals refer to similar elements and in which.

DETAILED DESCRIPTION

Figure 1:
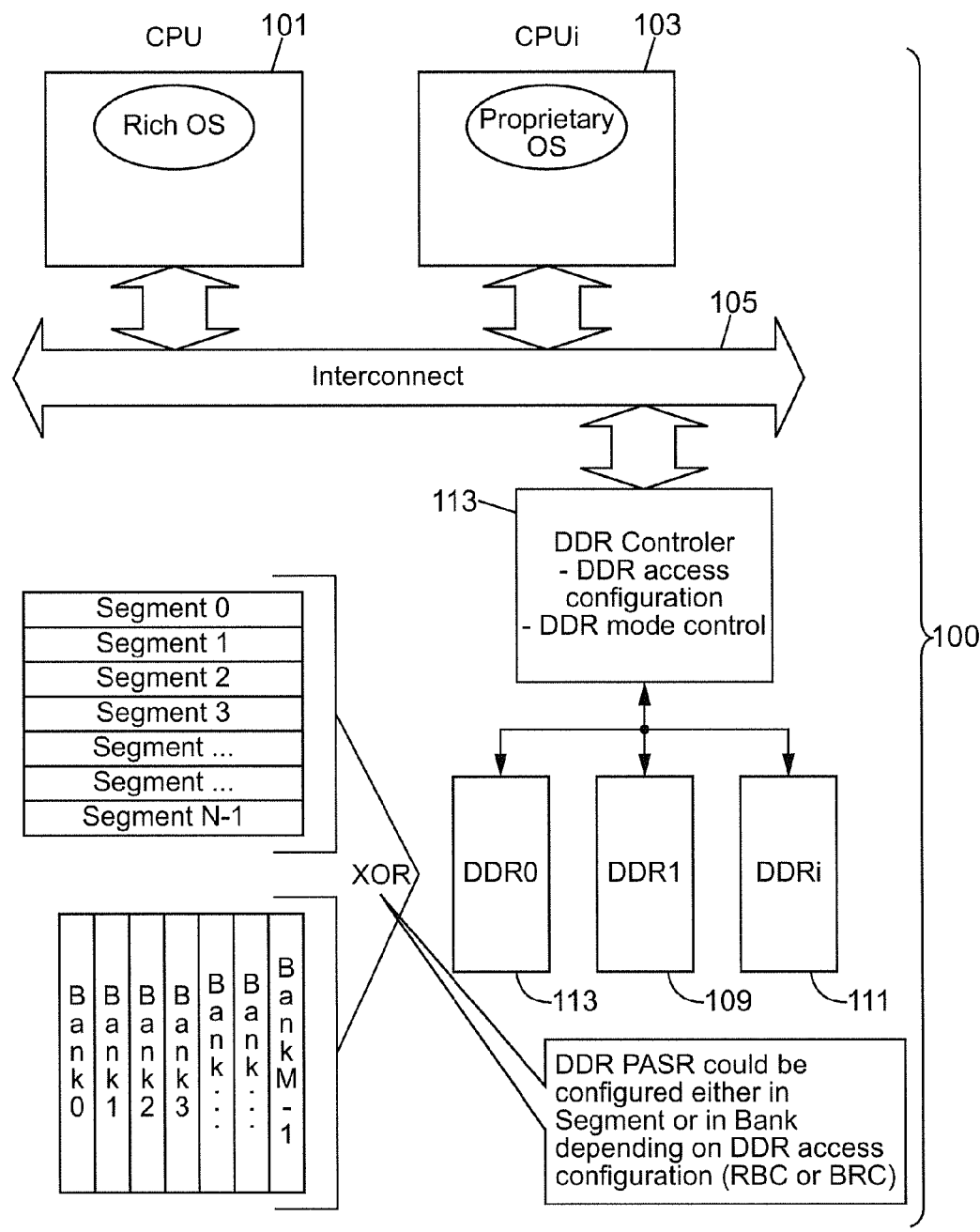
FIG. 1 is a schematic view of an example of chipset internal topology to which the described embodiments can be applied.

In the drawings, and throughout the following description, the following acronyms are used:
APASR: Automatic Partial Array Self Refresh
CPU: Central Processing Unit
DDR: Double Data Rate
DPD: Deep Power Down
FW: Framework
HW: Hardware
IP: Intellectual Property
LPDDR: Low Power Double Data Rate
OS: Operating System
PASR: Partial Self Refresh Embodiments rely on the idea of adding a new service layer between the CPU memory allocator and the DDR memory, to dynamically and automatically mask and unmask the refresh of DDR banks or segments.

This new layer provides an interface to the CPU. The Operating System notifies the new layer of the memory allocation and de-allocation operations, e.g. by providing the addresses and sizes of each chunk of memory.

Based on memory chunk information, this service layer may be adapted to decide to:
  mask the refresh of the DDR segments or banks related to memory chunk. In such cases DDR segments or banks will be excluded from a refresh process.
  unmask the refresh of the DDR segments or banks related to memory chunk. In such cases DDR segments or banks are accessible by the CPU (or by any other memory consumer), and will be included in the refresh process.

FIG. 1 illustrates an example of the internal hardware (HW) topology of an embedded chipset of a generalised processing system 100 for use with a described embodiment.

In the illustrated example, two CPUs 101, 103 are connected on the same interconnect bus 105. The invention is not intended to be limited by the number of CPUs, nor by the nature of the bus. Thus, whilst two CPUs 101, 103 are illustrated here, the skilled person will recognise that the invention can equally be implemented with a larger or smaller number of CPUs.

Also connected to the interconnect bus 105 are three DDR memory blocks 107, 109, 111. The three DDR memory blocks 107, 109, 111 are connected to the interconnect bus 105 via a DDR controller 113. Thus, the CPUs 101, 103 can receive stored information from and transmit information to each memory block 107, 109, 111 via the DDR controller 113.

The illustration of three memory blocks 107, 109, 111 is for illustrative purposes only, the skilled person will understand that the invention can be implemented with a larger or smaller number of memory blocks.

The term "memory block" is used here to encompass some subdivision of a larger array of memory. Memory is usually divided either into banks or into segments, dependent on the particular system architecture that is used. The embodiments herein described can be applied equally to bank or segment division, or to some other form of memory division. Thus, it should be understood that the term segment as used herein could equally be replaced with the term bank, or with the more general terms "block" or "portion".

The DDR controller is configured such that the memory blocks 107, 109, 111 can either be configured in terms of banks, or in terms of segments, the details of this will be discussed below.

If configured in terms of banks then, typically, a bank-row-column (BRC) memory addressing scheme can be utilised. Conversely, if configured in terms of segments then, typically, a row-bank-column (RBC) memory addressing scheme will be preferred.

The DDR controller 113 may be further configured so that each bank or segment of memory can be individually configured with self refresh masking.

Figure 2:
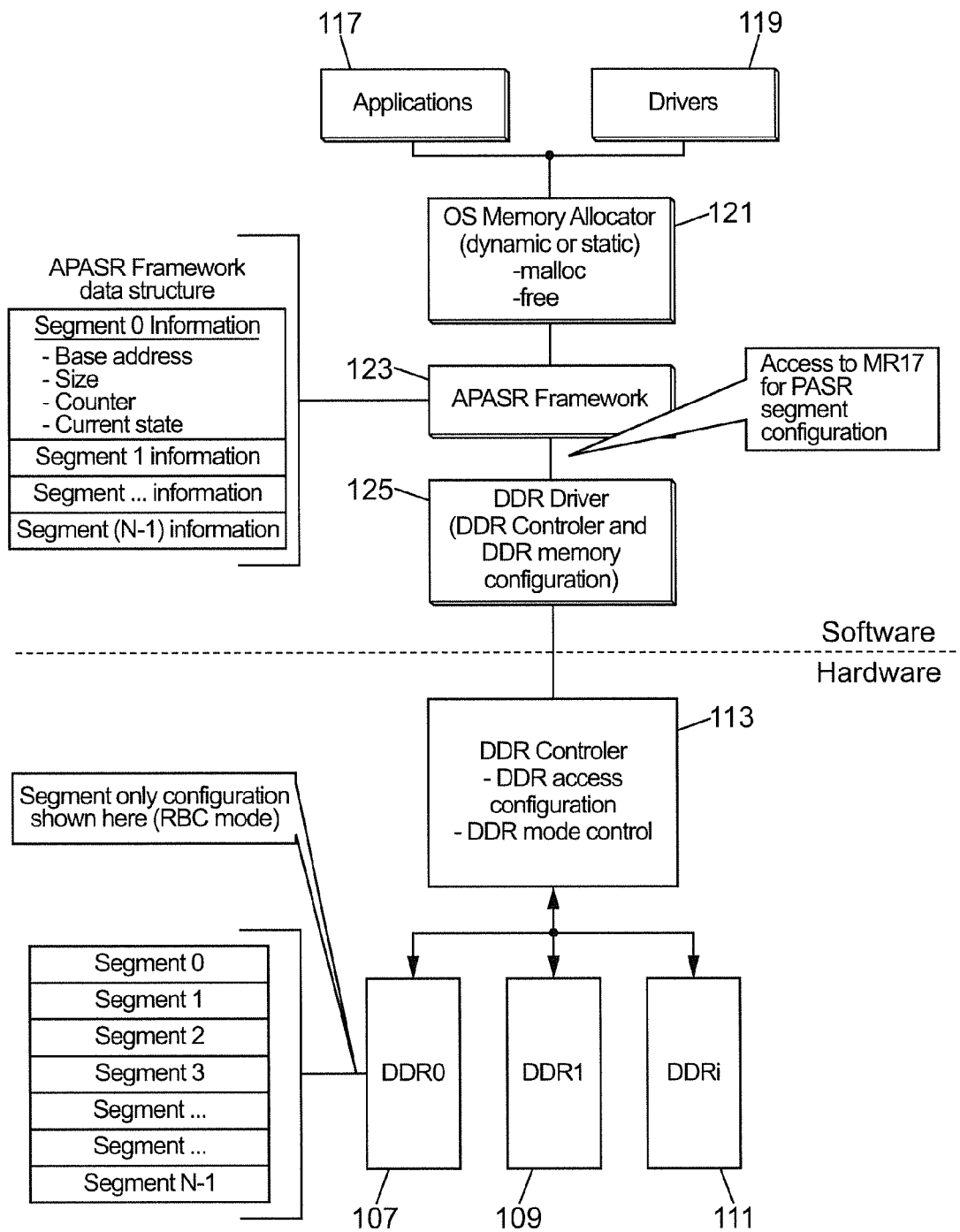
FIG. 2 is a schematic block diagram of an example embodiment applied in the form of software.

FIG. 2 illustrates a software architecture suitable for implementing the described embodiment. As illustrated in FIG. 2, both software applications 117 and software drivers 119 are available for exchange of instructions with an Operating System (OS) memory allocator 121. The skilled person will recognise that the memory allocator 121 can be either static or dynamic, and the particular choice is not important for the described embodiment.

The memory allocator 121 can also exchange instructions with an Automatic Partial Array Self Refresh Framework (APASR-FW) 123.

The APASR-FW 123 ultimately controls the masking of the DDR memory as will be discussed in detail below in relation to FIG. 3.

The APASR-FW 123 stores details of the DDR memory blocks 107, 109, 111 that are available to the system 100. These details include the physical base address and the size of each of the memory segments within the memory blocks 107, 109, 111. Additionally, the details include a counter for each memory segment.

Typically, 512 MB of DDR memory is usually available, and a typical segment size within this is 64 MB. In such an arrangement, there would be 8 segments present.

More generally, and as illustrated in FIG. 2, the memory is divided into N segments, labelled segment 0 to segment (N-1), where N is an integer number. Thus, as illustrated, there are N counters stored by the APASR-FW 123. The skilled person will recognise that the memory segments can be of varying sizes.

The APASR-FW 123 is configured to increase the counter for a segment each time the operating system memory allocator 121 allocates a portion of the memory from that segment. Conversely, each time that the memory allocator 121 frees a portion of the memory from a segment, the respective counter is decreased.

As illustrated in FIG. 2, the memory is configured in segments rather than in banks. However, if configured in banks, then the APASR-FW will be configured to increase the counter each time the operating system memory allocator 121 allocates a portion of the memory from the respective bank. Conversely, each time that the memory allocator 121 frees a portion of the memory from a bank, the respective counter is decreased.

The APASR-FW 123 can in turn exchange instructions with a DDR driver 125. Thus, the APASR-FW 123 is effectively located between the OS memory allocator 121 and the DDR driver 125. The DDR driver 125 in this case can be the existing DDR driver that would be utilised by prior art memory control algorithms.

Each of the Applications 117, the drivers 119, the OS memory allocator 121, the APASR_FIN 123 and the DDR driver 125 are software entities.

As illustrated in FIG. 2, the DDR driver 125 controls the DDR controller 113, and in turn the masking of segments within the memory blocks 107, 109, 111 as discussed in relation to FIG. 1. In particular, the DDR driver provides access to memory register 17 (MR17). The skilled person will recognise that MR17 is the register defined in the DDR2 specification which is used to control refresh masking of DDR memory segments. The skilled person will also recognise that, if the memory is configured in banks, then the relevant memory register is MR16. The skilled person will further recognise that the particular name of the memory register is not of relevance, and that in future DDR specifications a different register or registers could be used for the purpose of memory refresh control.

Figure 3:
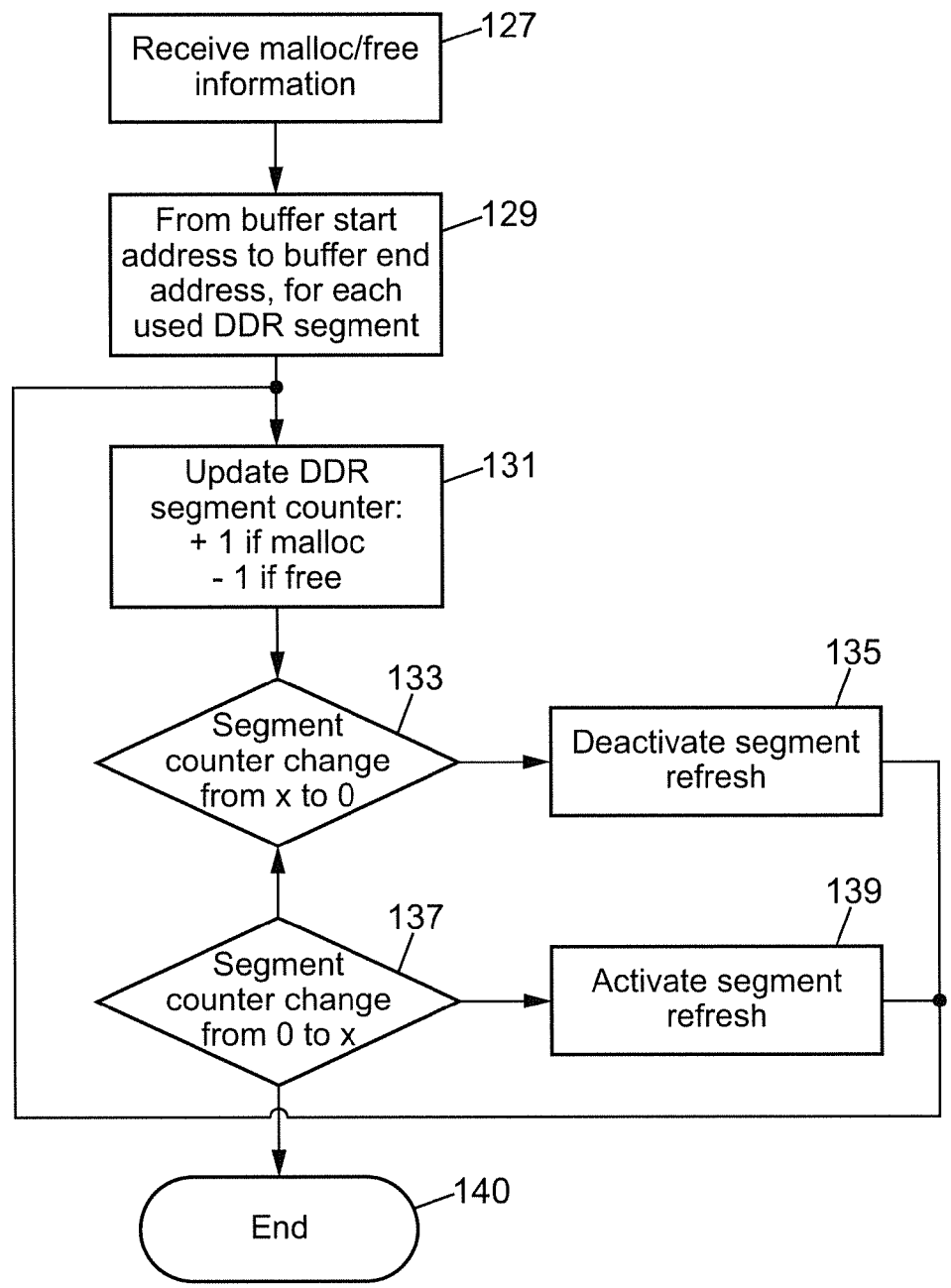
FIG. 3 is a flow chart illustrating steps of an algorithm as applied in an embodiment.

FIG. 3 illustrates details of the algorithm implemented by the APASR-FW 123 of FIG. 2. The algorithm is activated upon receipt of either a request for memory from a driver 119 operating in the system 100, or a notification that a piece of memory that was in use is no longer required. When this occurs, the memory allocator 121 will receive a message indicating the request/notification.

A request for memory will include information as to the amount of memory required, while a notification will contain information detailing the memory that is no longer required.

The memory allocator 121 will respond to a request or notification by transmitting a message comprising the start address and the memory size that is to be allocated or freed. Here, a request for allocation of memory is termed memory allocated (malloc), while a notification of freed memory is termed "free".

The APASR_FW 123 receives 127 this message and analyses 129 it to determine in which segment or segments the assigned/freed memory is located. The APASR_FW 123 performs the analysis by comparing the base address of the assigned/freed memory with the known addresses of the segments.

After the analysis 129, the APASR_FW 123 then updates 131 the DDR segment counters on the basis of the segments that have been identified.

Each time that a piece of allocated memory is identified to be in a particular segment, the counter for that segment is incremented. Conversely, each time that a piece of freed memory is identified to be in a particular segment, the counter for that segment is decremented.

After update 131 of the counters, the status change in the counters is then examined 133, 137. If a counter for a particular segment is observed 133 to have changed from x to 0 (where x>0), then it can be assumed that no part of the segment is now allocated for information storage. Accordingly, there is no information stored in that segment and thus refresh for that segment is deactivated 135 (masked).

Conversely, if a counter for a particular segment is observed 137 to have changed from 0 to x (where x>0), then it can be assumed that the segment, which was previously empty, now has information stored in at least a part of it. Thus, refresh for that segment is activated 139 (un-masked).

Where the status of a counter has not changed as described above, then the refresh status is maintained at its previous state (either masked or un-masked).

Once the status of each counter has been examined 133, 137, the algorithm ends 140. The APASR_FW then informs the DDR driver 125, via MR17, of the refresh status (or refresh status change) of each segment in the memory 107, 109, 111. The DDR controller 113 then uses this information to set the refresh status of each memory segment. Thus, only memory segments which actually hold stored information will be refreshed. Accordingly, energy is not wasted on refreshing empty memory segments. Thus, since power consumption changes according to the amount of memory used by the system, embedded systems which use the described embodiment can exhibit reduced global power consumption and DDR power consumption.

The algorithm is repeated each time a message relating to memory allocation or de-allocation is received from the OS memory allocator 121. Thus, the refresh status of the memory segments is maintained in accordance with currently allocated memory.

Upon initialisation, for example at boot-up of the system 100, all of the counters will be set to zero since no memory will be allocated prior to system initialisation.

This embodiment has the additional advantage that there is no impact to the OS memory manager/allocator 121. A simple hook (i.e. a function call) allows adding a notification mechanism to indicate when a chunk of memory is allocated or freed. In comparison, prior art solutions generally rely on removing a chunk of memory from the responsibility of the OS memory allocator. With such a solution, it is easy to unplug some chunks of memory and to unmask associated bank/segment refresh. However, defining when to re-plug the different unplugged chunk of memory may prove difficult. The described embodiment overcomes this limitation.

The described embodiment also has the advantage that chunks of memory need not to be suppressed from global memory management. Further, the size of memory chunks can be aligned with hardware memory characteristics without any dependency on the OS memory allocator algorithm. In addition, DDR segment refresh activation/deactivation can be automatic. This allows reducing platform power consumption as soon as a memory bank/segment is not used by the system. A further advantage is that there is no added latency, from the system point of view, due for example to plug/unplug management. A yet further advantage is that this method is compliant with all memory chunk definitions; it could be applied for one DDR segment only or for a complete DDR die.

The described embodiment is not involved with the issue of memory fragmentation. Rather, the responsibility to reduce memory fragmentation in order to improve the quality of service remains with the OS memory allocator.

Figure 4:
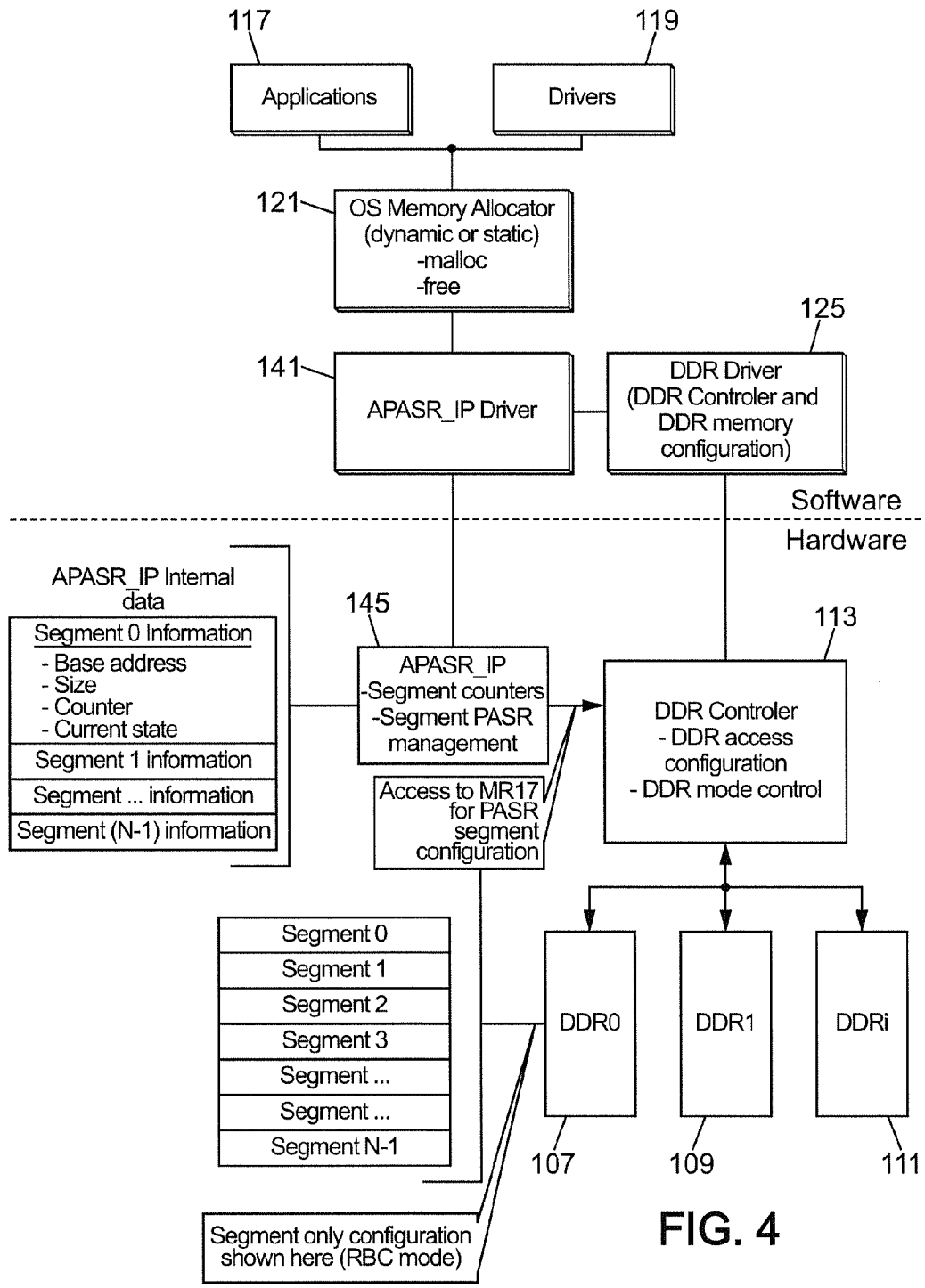
FIG. 4 is a schematic block diagram of a further embodiment corresponding to a full hardware implementation.

FIG. 4 illustrates an alternative embodiment of the present invention, which is implemented in hardware. As illustrated in FIG. 4, and in a similar fashion to the embodiment described in relation to FIG. 2, both software applications 117 and software drivers 119 are configured to be in communication with an OS memory allocator 121. The memory allocator 121 is in turn in communication with an APASR_IP driver 141. The APASR_IP driver 141 is in turn in communication with a DDR driver 125. Again, the DDR driver 125 can be the existing DDR driver that would be utilised by prior art memory control algorithms.

Each of the Applications, 117, the drivers 119, the OS memory allocator 121, the APASR_IP driver 141 and the DDR driver 125 are software entities.

The APASR_IP driver 125 is in communication with a hardware device called an APASR_IP block 145. The APASR_IP block 145 provides hardware means for implementing segment counters, and for segment PASR management. The function of this will be explained below.

The APASR_IP block 145 and the DDR driver 125 are each in communication with a hardware DDR controller 113. The hardware DDR controller 113 can be a standard DDR controller that would be present in a memory management system for a prior art processing system. The DDR controller 113 controls DDR memory blocks 107, 109, 111 as described above in relation to FIG. 2.

The APASR_IP block 145 can also be connected between the DDR controller 113 and a system bus, for example the front side bus. Thus, the DDR controller 113 can provide a control interface to the CPU.

In use, the configuration described in relation to FIG. 4 is configured to perform the algorithm described in relation to FIG. 3 as follows. The APASR_IP driver 141 receives memory allocation information from the OS memory allocator 121, and processes it in the manner described in relation to FIG. 2. Details of the segment counters are then passed to the APASR_IP block 145 for storage. The APASR_IP block 145 then uses the stored information to determine whether segment transitions have occurred and to activate or deactivate segment refresh accordingly, as described in relation to FIG. 2. The required activation/deactivation information is then passed to the DDR controller 113.

Thus, the second embodiment can implement the same mechanism as described above with reference to the first embodiment, but in hardware rather than in software. The APASR_IP block 145 manages counters by DDR segment. At each allocation/de-allocation, the OS memory allocator 121 accesses the APASR_IP driver 141 to notify it with used/free memory information. The APSR_IP block 145 then automatically updates its internal usage counter for each segment and manages segment refresh activation/deactivation. The APASR_IP block 145 is connected to the system bus and will detect the first access to this dedicated segment. Thus, memory access to un-refreshed memory segments is prevented.

Figure 5:
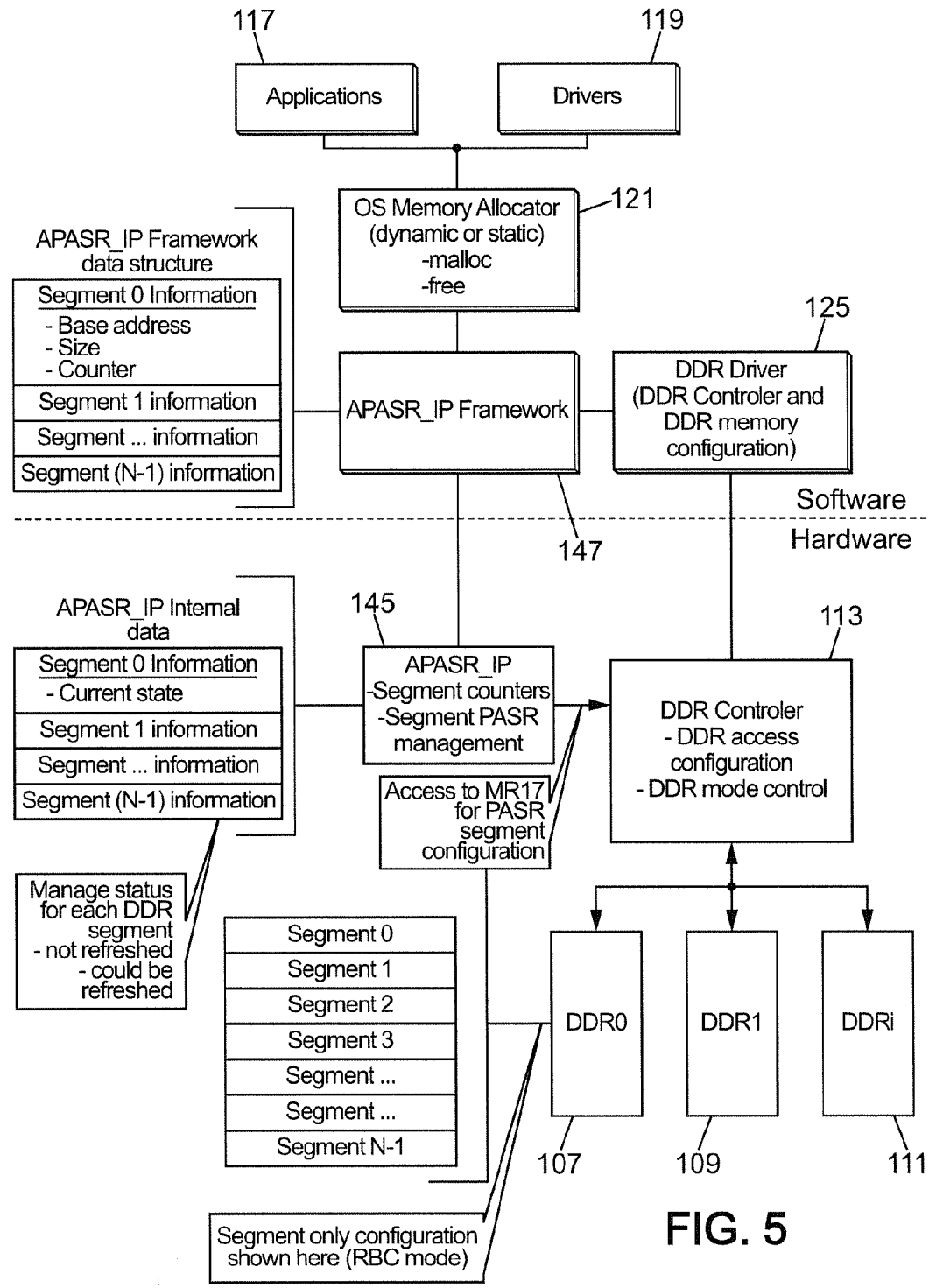
FIG. 5 is a schematic block diagram of third embodiment corresponding to a mixed hardware and software implementation.

FIG. 5 illustrates a further embodiment in which a combination of software and hardware is used to implement the partial self refresh functionality. In the same manner as described in relation to FIG. 2, applications 117 and drivers 119 are in communication with an OS memory allocator 121. The nature and functionality of these features can be essentially the same as discussed in relation to FIG. 2, and so need not be repeated here. The OS memory allocator 121 is in communication with an APASR_IP framework 147, which in turn is in communication with a DDR driver 125. On the hardware side, an APASR_IP 145 is in communication with the APASR_IP framework 147, and is configured to store segment counters and segment PASR management information, and control in the same manner as discussed in relation to FIG. 4.

Thus, in this embodiment, the hardware APASR_IP block 145 is only in charge of bank/segment refresh management. The bank/segment usage counter is managed by the associated APASR_IP framework 147. The DDR driver 125 is connected to the OS memory allocator 121 and is notified with used/free memory chunk information.

When a segment count is equal to 0, the APASR_IP framework 147 sends a request to the APASR_IP block 145 to mask refresh of the corresponding segment. Conversely, when the segment count changes from 0 to X, the APASR_IP framework 147 notifies the APASR_IP block 145 that the segment should be set in refresh mode when system requests access to this segment. The APASR_IP block 145 is connected to the system bus and will detect the first access to this dedicated segment. Thus, memory access to un-refreshed memory segments is prevented.

In alternative or complimentary embodiments each counter is configured to be set to represent a measure of the segment size represented by that counter during initialisation. In such embodiments, each time a piece of memory in a segment is allocated, the corresponding counter will be reduced. Conversely, each time a piece of allocated memory from the segment is freed from use, the corresponding counter will be increased. In such embodiments, the determination of whether a particular segment should be activated or deactivated from segment refresh can be made by comparing the current counter value with the initial value. If the counter value is lower than the initial value, then information is stored in the memory and the segment will be activated for refresh. In such embodiments, the counter increment can be configured to be representative of the size of the piece of memory that is allocated. Thus, in such embodiments the counter for a given segment will be zero if the segment is fully allocated.

The skilled reader will understand that the counters described above are merely examples of counters that can be used with the described embodiments, and that counters having differing initial values and increments/decrements can equally be used as alternatives.

In alternative or complimentary embodiments the memory can be configured in banks rather than in segments as described above. The skilled person will recognise that in such embodiments, the segment counters will be replaced with bank counters, while the remainder of the functions will remain essentially similar. Moreover, the skilled person will recognise that the described embodiments can be applied to memory that is divided in an arbitrary fashion. Thus, whilst the embodiments have been described in terms of memory divided into segments, this definition should be construed broadly. Thus, the term segment as used herein can be used to define any subdivision of a memory array, and the skilled person will recognise that the embodiments described can be applied to any memory having any such subdivision.

In alternative or complimentary embodiments, the APAS-R_IP framework 123 is configurable to take into account DDR internal topology. In other words the number of segments/banks, size, Chip Select (CS) signal, base address, and so forth can be taken into account. Thus, in such embodiments, support can be provided for interleaving and firewall modes.

In alternative or complementary embodiments, the APAS-R_IP framework 123 is configured to mask or unmask the refresh of DDR segments or banks, by directly accessing an internal DDR controller register if no DDR driver exists on the platform of the embedded system.

As mentioned above, embodiments can be embedded in a computer program product, which comprises all the features enabling the implementation of the methods described herein, and which—when loaded in an information processing system—is able to carry out these methods. Computer program means or computer program in the present context mean any expression, in any language, code or notation, of a set of instructions intended to cause a system having an information processing capability to perform a particular function either directly or after either or both of the following a) conversion to another language. Such a computer program can be stored on a computer or machine readable medium allowing data, instructions, messages or message packets, and other machine readable information to be read from the medium. The computer or machine readable medium may include non-volatile memory, such as ROM, Flash memory, Disk drive memory, CD-ROM, and other permanent storage. Additionally, a computer or machine readable medium may include, for example, volatile storage such as RAM, buffers, cache memory, and network circuits. Furthermore, the computer or machine readable medium may comprise computer or machine readable information in a transitory state medium such as a network link and/or a network interface, including a wired network or a wireless network, that allow a device to read such computer or machine readable information.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the invention as broadly defined above.

A person skilled in the art will readily appreciate that various parameters disclosed in the description may be modified and that various embodiments disclosed and/or claimed may be combined without departing from the scope of the invention.

The invention claimed is:

1. A method of configuring dynamic memory associated with a processing system, the dynamic memory being configured in a plurality of blocks, the method comprising:
   a) receiving, from a memory allocator, information relating to a utilisation status of the dynamic memory;
   b) adjusting a counter for each block of the dynamic memory each time the received information identifies that information is to be stored in that block and each time the received information identifies that a part of the block has been freed from use for information storage;
   c) determining, by comparing a value of the counter for at least one first block of dynamic memory with an initial value, that at least one first block of the dynamic memory is currently not in use for information storage;
   d) accessing a register of the dynamic memory to mask the at least one first block of the dynamic memory so that the at least one first block is excluded from an information refresh process; and
   e) performing an automatic partial array self-refresh of the dynamic memory based on masking and unmasking information in the register of the dynamic memory so that the at least one first block of the dynamic memory is excluded from the automatic partial array self-refresh,
   wherein a size of the counter increment is representative of a size of a piece of the memory that is allocated,
   wherein the counter is maintained externally to the dynamic memory and externally to a memory controller, and
   wherein after performing the automatic partial array self-refresh the at least one first block of the dynamic memory appears as refreshed to the memory allocator.

2. A method according to claim 1, wherein the processing further comprises using the received information to determine at least one second block of the dynamic memory that is currently in use for information storage, and the configuring further comprises configuring the at least one second block to be included in the information refresh process.

3. A method according to claim 1, wherein the received information comprises a base address and size of a portion of the dynamic memory that is in use for information storage or that has been freed from use for information storage.

4. A method according to claim 1 wherein actions a)-d) are repeated each time a message relating to a utilisation status of the dynamic memory is received.

5. A method according to claim 1, wherein the blocks of dynamic memory are memory segments or memory banks.

6. A non-transitory computer readable medium comprising computer program code configuring dynamic memory associated with a processing system, the dynamic memory being configured in a plurality of blocks, wherein execution of the computer program code by a computer causes the computer to:
   a) receive, from a memory allocator, information relating to a utilisation status of the dynamic memory;
   b) adjust a counter for each block of the dynamic memory each time the received information identifies that information is to be stored in that block and each time the received information identifies that a part of the block has been freed from use for information storage;
   c) determine, by comparing a value of the counter for at least one first block of dynamic memory with an initial value, that at least one first block of the dynamic memory is currently not in use for information storage;
   d) access a register of the dynamic memory to mask the at least one first block of the dynamic memory so that the at least one first block is excluded from an information refresh process; and
   e) perform an automatic partial array self-refresh of the dynamic memory based on masking and unmasking information in the register of the dynamic memory so that the at least one first block of the dynamic memory is excluded from the automatic partial array self-refresh,
   wherein a size of the counter increment is representative of a size of a piece of the memory that is allocated,
   wherein the counter is maintained externally to the dynamic memory and externally to a memory controller, and
   wherein after performing the automatic partial array self-refresh the at least one first block of the dynamic memory appears as refreshed to the memory allocator.

7. A method of configuring dynamic memory associated with a processing system, the dynamic memory being configured in a plurality of blocks, the method comprising:
   setting a counter for the at least one first block of memory to an initial value corresponding to a size of the block of the dynamic memory at initialization of the processing system,
   receiving a notification from an operation system memory controller of an allocation of at least one first block of the dynamic memory;
   adjusting a counter for the at least one first block of dynamic memory by a counter decrement representative of a size of a piece of the memory that is allocated by the notification;
   instructing a second memory controller to unmask refreshing of the at least one first block of dynamic memory based on a comparison of a value of the counter with the initial value, wherein the instructing of the second memory controller is performed via a memory driver;
   instructing the second memory controller to mask refreshing at least one second block of dynamic memory; and
   performing an automatic partial array self-refresh of the dynamic memory so that the at least one first block of the dynamic memory is included in the automatic partial array self-refresh and the at least one second block of dynamic memory is excluded from the automatic partial array self-refresh, wherein after performing the automatic partial array self-refresh the at least one first and second blocks of the dynamic memory appear as refreshed to the operating system memory controller.

8. A method according to claim 7, further comprising:
   receiving a second notification from the operation system memory controller of a de-allocation of the at least one first block of the dynamic memory;
   adjusting the counter for the at least one first block of dynamic memory by a counter increment representative of a size of a piece of the memory that is de-allocated;
   instructing the second memory controller, via the memory driver, to mask refreshing of the at least one first block of dynamic memory based on the comparison of the value of the counter with the initial value.

9. A method according to claim 7, wherein the instructing of the second memory controller causes information to be written into a specific register of the dynamic memory used to control refresh masking of the dynamic memory.

10. A method according to claim 7, wherein the blocks of dynamic memory are memory segments or memory banks.

11. A method according to claim 7, wherein the received notification includes a base address and size of a portion of the dynamic memory that is in use for information storage.

12. The method of claim 1, wherein
   the counter is set to an initial value corresponding to a size of the block of the dynamic memory at initialization of the processing system,
   the counter for a block is decremented each time the processing identifies that information is to be stored in that block, and
   the counter is incremented each time the processing identifies that a part of the block has been freed from use for information storage.

13. The method of claim 1, wherein steps a)-c) are performed externally to the dynamic memory and externally to the memory controller.

14. The non-transitory computer readable medium of claim 6, wherein
   the counter is set to an initial value corresponding to a size of the block of the dynamic memory at initialization of the processing system,
   the counter for a block is decremented each time the processing identifies that information is to be stored in that block, and
   the counter is incremented each time the processing identifies that a part of the block has been freed from use for information storage.

15. The non-transitory computer readable medium of claim 6, wherein steps a)-c) are performed externally to the dynamic memory and externally to the memory controller.

16. The method of claim 7, wherein the counter is maintained externally to the dynamic memory and externally to the second memory controller.

* * * * *

UNITED STATES PATENT AND TRADEMARK OFFICE
CERTIFICATE OF CORRECTION

PATENT NO. : 9,601,180 B2
APPLICATION NO. : 14/372244
DATED : March 21, 2017
INVENTOR(S) : Coquelin et al.

Page 1 of 1

It is certified that error appears in the above-identified patent and that said Letters Patent is hereby corrected as shown below:

On the Title Page

Item (71), under "Applicant", in Column 1, Lines 1-2, delete "ST-Ericsson SA, En Liquidation, Plan-les-Ouates(CH)" and insert -- Optis Circuit Technology, LLC, Plano, TX (US) --, therefor.

In the Specification

In Column 5, Line 19, delete "(APASR-FW)" and insert -- (APASR_FW) --, therefor.

In Column 5, Line 20, delete "APASR-FW" and insert -- APASR_FW --, therefor.

In Column 5, Line 23, delete "APASR-FW" and insert -- APASR_FW --, therefor.

In Column 5, Line 35, delete "APASR-FW" and insert -- APASR_FW --, therefor.

In Column 5, Line 38, delete "APASR-FW" and insert -- APASR_FW --, therefor.

In Column 5, Line 46, delete "APASR-FW" and insert -- APASR_FW --, therefor.

In Column 5, Line 52, delete "APASR-FW" and insert -- APASR_FW --, therefor.

In Column 5, Line 53, delete "APASR-FW" and insert -- APASR_FW --, therefor.

In Column 5, Line 59, delete "APASR_FIN" and insert -- APASR_FW --, therefor.

In Column 6, Line 9, delete "APASR-FW" and insert -- APASR_FW --, therefor.

Signed and Sealed this
Twenty-fourth Day of December, 2019

Andrei Iancu
*Director of the United States Patent and Trademark Office*